United States Patent
Kim

(10) Patent No.: US 9,306,054 B2
(45) Date of Patent: Apr. 5, 2016

(54) SEMICONDUCTOR DEVICE AND A METHOD OF FABRICATING THE SAME

(71) Applicant: SAMSUNG ELECTRONICS CO., LTD., Gyeonggi-do (KR)

(72) Inventor: Jin-Bum Kim, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 293 days.

(21) Appl. No.: 13/901,653

(22) Filed: May 24, 2013

(65) Prior Publication Data

US 2014/0346608 A1 Nov. 27, 2014

(51) Int. Cl.
| | |
|---|---|
| H01L 29/78 | (2006.01) |
| H01L 21/28 | (2006.01) |
| H01L 27/092 | (2006.01) |
| H01L 29/66 | (2006.01) |
| H01L 21/8238 | (2006.01) |
| H01L 21/285 | (2006.01) |
| H01L 29/49 | (2006.01) |
| H01L 29/51 | (2006.01) |
| H01L 29/165 | (2006.01) |

(52) U.S. Cl.
CPC .......... *H01L 29/78* (2013.01); *H01L 21/28008* (2013.01); *H01L 21/28518* (2013.01); *H01L 21/823807* (2013.01); *H01L 21/823814* (2013.01); *H01L 27/092* (2013.01); *H01L 29/665* (2013.01); *H01L 29/66545* (2013.01); *H01L 29/66636* (2013.01); *H01L 29/7848* (2013.01); *H01L 29/165* (2013.01); *H01L 29/4966* (2013.01); *H01L 29/517* (2013.01); *H01L 29/6656* (2013.01)

(58) Field of Classification Search
CPC ....................... H01L 29/66636; H01L 29/7845
See application file for complete search history.

(56) References Cited

U.S. PATENT DOCUMENTS

| | | | |
|---|---|---|---|
| 7,608,515 B2 | 10/2009 | Chen et al. | |
| 7,838,372 B2 | 11/2010 | Han et al. | |
| 7,972,958 B2 | 7/2011 | Lee et al. | |
| 8,067,281 B1 | 11/2011 | Chen et al. | |
| 2006/0038229 A1 | 2/2006 | Tsuchiya et al. | |
| 2006/0199343 A1 | 9/2006 | Jung et al. | |
| 2008/0251851 A1 | 10/2008 | Pan et al. | |
| 2009/0114956 A1* | 5/2009 | Tamura | 257/288 |
| 2011/0095343 A1* | 4/2011 | Chan | H01L 29/165 257/288 |

FOREIGN PATENT DOCUMENTS

| | | |
|---|---|---|
| JP | 2011-151166 | 8/2011 |
| KR | 1020070096507 | 10/2007 |
| KR | 1020080098894 | 11/2008 |

\* cited by examiner

*Primary Examiner* — Thomas L Dickey
(74) *Attorney, Agent, or Firm* — F. Chau & Associates, LLC

(57) ABSTRACT

A method of fabricating a semiconductor device is provided. A plurality of first gate electrode structure is formed on a substrate. A recess is formed in the substrate, wherein the recess is formed between two adjacent first gate electrode structures of the plurality of first gate electrode structure. A diffusion prevention layer includes a first material and is formed on the recess of the substrate. A first pre-silicide layer includes a second material different from the first material and is formed on the diffusion prevention layer. A metal layer is formed on the first pre-silicide layer. The first pre-silicide layer and the metal layer are changed to a first silicide layer by performing an annealing process to the substrate. The diffusion prevention layer prevents metal atoms of the metal layer from diffusing to the substrate, and the first silicide layer comprises a monocrystalline layer.

15 Claims, 16 Drawing Sheets

SEMICONDUCTOR DEVICE AND A METHOD OF FABRICATING THE SAME

TECHNICAL FIELD

The present inventive concept relates to a semiconductor device and a method of fabricating the same.

DISCUSSION OF RELATED ART

With the development of electronic technology, semiconductor devices are getting smaller and faster. Accordingly, various structures of a transistor have been proposed to secure reliability of semiconductor devices.

SUMMARY

According to an exemplary embodiment of the inventive concept, a method of fabricating a semiconductor device is provided. A plurality of first gate electrode structure is formed on a substrate. A recess is formed in the substrate, wherein the recess is formed between two adjacent first gate electrode structures of the plurality of first gate electrode structure. A diffusion prevention layer includes a first material and is formed on the recess of the substrate. A first pre-silicide layer includes a second material different from the first material and is formed on the diffusion prevention layer. A metal layer is formed on the first pre-silicide layer. Metal atoms of the metal layer are diffused to the first pre-silicide layer in the annealing process and the diffusion prevention layer prevents the metal atoms from diffusing to the substrate. The first silicide layer includes a monocrystalline layer.

According to an exemplary embodiment of the inventive concept, a semiconductor device is provided. The semiconductor device includes a substrate having a surface and a first recess. A first gate electrode structure is disposed on the surface of the substrate. A diffusion prevention layer is disposed on the first recess of the substrate. A first silicide layer includes a monocrystalline layer, has a first thickness, and is disposed on the diffusion prevention layer. The first silicide layer laterally overlaps a channel region disposed in the substrate and under the first gate electrode structure.

According to an exemplary embodiment of the inventive concept, a semiconductor device is further provided. The semiconductor device includes an N-channel metal oxide semiconductor (NMOS) transistor having a first gate electrode structure disposed on a substrate, a source/drain region having a first recess of the substrate, and a first channel region disposed in the substrate and under the first gate electrode structure. A diffusion prevention layer is disposed on the first recess. A first silicide layer has a first thickness and is disposed on the diffusion prevention layer. The first silicide layer laterally overlaps the first channel region of the NMOS transistor, applying a tensile stress to the first channel region.

BRIEF DESCRIPTION OF THE DRAWINGS

These and other features of the inventive concept will become more apparent by describing in detail exemplary embodiments thereof with reference to the attached drawings of which.

DETAILED DESCRIPTION OF THE EMBODIMENTS

Figure 1:
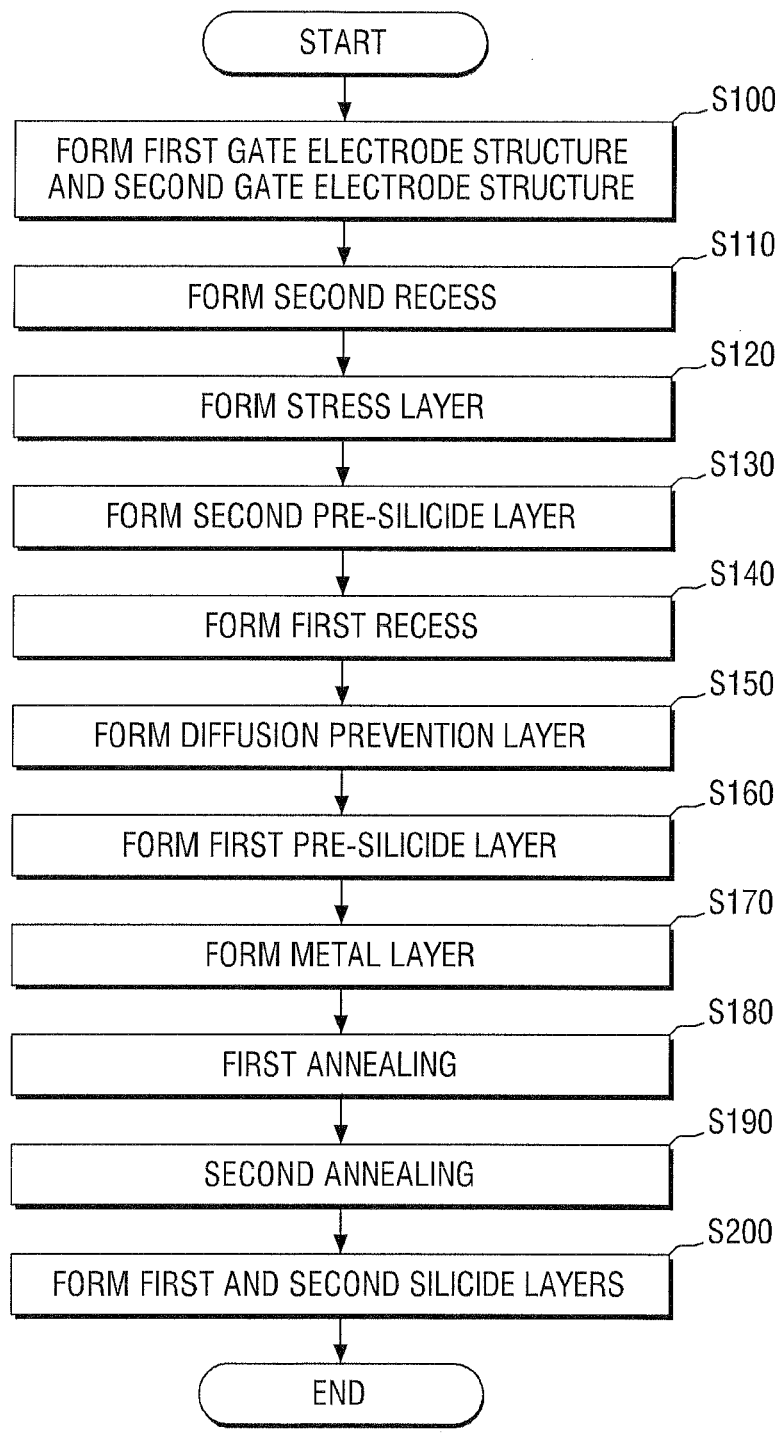
FIG. 1 is a flowchart illustrating a method of fabricating a semiconductor device according to an exemplary embodiment of the inventive concept.

Exemplary embodiments of the inventive concept will be described below in more detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

As used herein, singular "a," "an," and "the" are intended to cover the plural forms as well, unless the context clearly indicates otherwise.

It will also be understood that when a layer is referred to as being "on" another layer or substrate, it may be directly on the other layer or substrate, or intervening layers may also be present.

A method of fabricating a semiconductor device according to an exemplary embodiment of the inventive concept will now be described with reference to FIGS. 1 through 9.

FIG. 1 is a flowchart illustrating a method of fabricating a semiconductor device according to an exemplary embodiment of the inventive concept. FIGS. 2 through 9 are views illustrating steps of a method of fabricating a semiconductor device according to an exemplary embodiment of the inventive concept.

Figure 2:
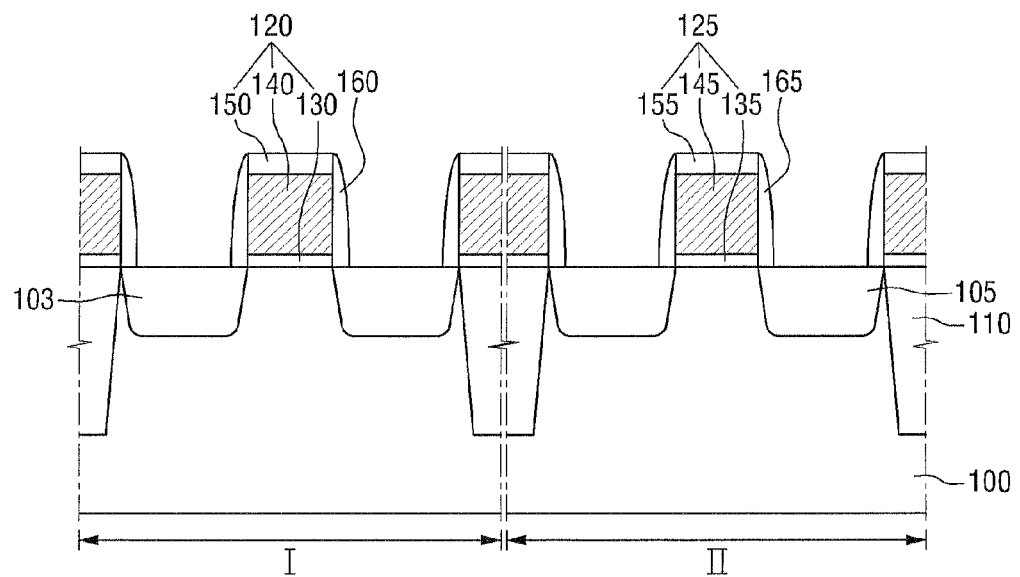
FIGS. 2 through 9 are views illustrating steps of a method of fabricating a semiconductor device according to an exemplary embodiment of the inventive concept.

Referring to FIGS. 1 and 2, in S100, a first gate electrode structure 120 is formed on a first area I of a substrate 100, and a second gate electrode structure 125 is formed on a second area II of the substrate 100.

The substrate 100 may include a silicon substrate, a silicon-on-insulator (SOI) substrate, and/or a silicon germanium substrate. The substrate 100 includes the first area I and the second area II. The first area I and the second area II are separated by a device isolation region 110 such as a shallow trench isolation (STI) region. In the first area I, a p-channel metal oxide semiconductor (PMOS) transistor may be formed, and in the second area II, an n-channel metal oxide semiconductor (NMOS) transistor may be formed. However, the present inventive concept is not limited thereto. For example, the first area I may include an NMOS transistor, and the second area II may include a PMOS transistor. Hereinafter, it is assumed that for the convenience of explanation, the first area I includes a PMOS transistor and that the second area II includes an NMOS transistor.

The first gate electrode structure 120 is formed on the first area I of the substrate 100, and the second gate electrode structure 125 is formed on the second area II of the substrate 100. The first and second gate electrode structures 120 and 125, respectively, include gate insulating layers 130 and 135, gate electrodes 140 and 145, and gate masks 150 and 155.

The gate insulating layers 130 and 135 may include SiON, GexOyNz, GexSiyOz, a high-k material, or a combination thereof. In an exemplary embodiment, the gate insulating layers 130 and 135 may include a sequential stack of these materials. The high-k material may include $HfO_2$, $ZrO_2$, Al$_2$O$_3$, Ta$_2$O$_5$, HfO$_4$ (hafnium silicate), ZrO$_4$ (zirconium silicate), or a combination thereof. In an exemplary embodiment, the gate insulating layers 130 and 135 may include a combined layer of these high-k materials. The gate insulating layers 130 and 135 may be formed by a chemical vapor deposition (CVD) process, a physical vapor deposition (PVD) process, an atomic layer deposition (ALD) process, or a thermal oxidation process.

The gate electrodes 140 and 145 are formed on the gate insulating layers 130 and 135, respectively. Each of the gate electrodes 140 and 145 may include, but is not limited to, a single layer of poly-Si, poly-SiGe, poly-Si doped with impurities, a metal such as Ta, TaN, TaSiN, TiN, Mo, Ru, or Ni, or metal silicide such as NiSi. In an exemplary embodiment, each of the gate electrodes 140 and 145 may include a stacked layer of these materials. Depending on the type of a transistor implemented on the substrate 100, the gate electrodes 140 and 145 may include n-type impurities or p-type impurities.

The gate masks 150 and 155 are formed on the gate electrodes 140 and 145, respectively. The gate masks 150 and 155 may include, but are not limited to, silicon oxide or silicon nitride. The gate masks 150 and 155 may be formed by a CVD process. The gate electrodes 140 and 145 may be protected by the gate masks 150 and 155.

Spacers 160 and 165 are formed on both sidewalls of the first and second gate electrode structures 120 and 125 to protect the first and second gate electrode structures 120 and 125. The spacers 160 and 165 may include silicon oxide, silicon nitride, and/or silicon oxynitride. In the drawings, each of the spacers 160 and 165 are formed as a single layer. However, the present inventive concept is not limited thereto, and each of the spacers 160 and 165 may include a multilayer.

As shown in FIG. 2, a first source/drain region 103 is formed in the substrate 100. In an exemplary embodiment, an ion implantation process may be performed on the first region I of the substrate 100 to form the first source/drain region 103. A second source/drain region 105 is further formed in the substrate 100 by performing an ion implantation process on the second region II of the substrate 100.

Figure 3:
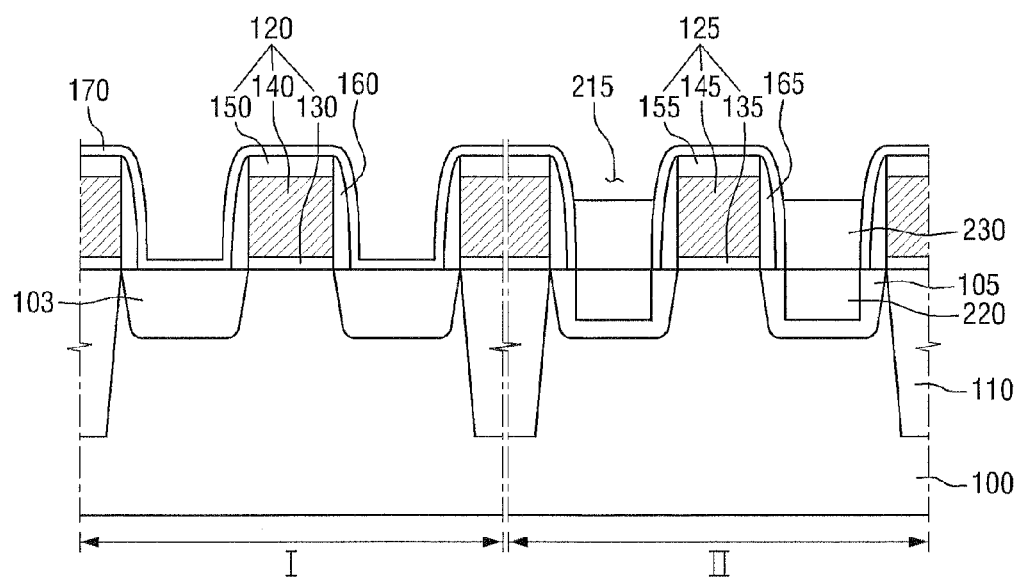

Referring to FIGS. 1 and 3, in S110, a second recess 215 is formed in the second area II of the substrate 100. The second recess 215 is positioned between two adjacent second gate electrode structures 125. The second recess 215 may be formed by forming a first block layer 170 on the resulting structure of FIG. 2 and the second recess 215 may be formed by etching the first block layer formed on the second area II and a portion of the second area II to a predetermined depth. The portion is a region on which the second gate electrode structure 125 is not disposed. The first block layer 170 may be conformally formed on the structure of FIG. 2. The first block layer 170 may serve to prevent the formation of a stress layer 220 and a second pre-silicide layer 230 in the first area I in S120 and S130.

In S120, the stress layer 220 including a third material is selectively formed in the second recess 215. For example, the stress layer 220 is not formed on the first block layer 170, but is formed on an exposed surface of second area II by the second recess 215. The stress layer 220 formed in the second area II may serve to apply compressive stress to a channel region located under the second gate electrode structure 125. Therefore, the stress layer 220 may include a material having a greater lattice constant than the material that the substrate 100 may include. For example, if the substrate 100 includes silicon (Si), the stress layer 220 may include SiGe. Therefore, the third material may include Ge. However, the present inventive concept is not limited thereto.

The stress layer 220 laterally overlaps the channel region. The stress layer 220 may apply compressive stress to the channel region. The channel region is disposed in an upper region of the substrate 100 under the bottom surface of the second gate electrode structure 125. The top surface of the stress layer 220 may be at least as high as a top surface of the substrate 100. For example, the top surface of the stress layer 220 may be level with the top surface of the substrate 100. Alternatively, the top surface of the stress layer 220 may be higher than the top surface of the substrate 100.

Figure 9:
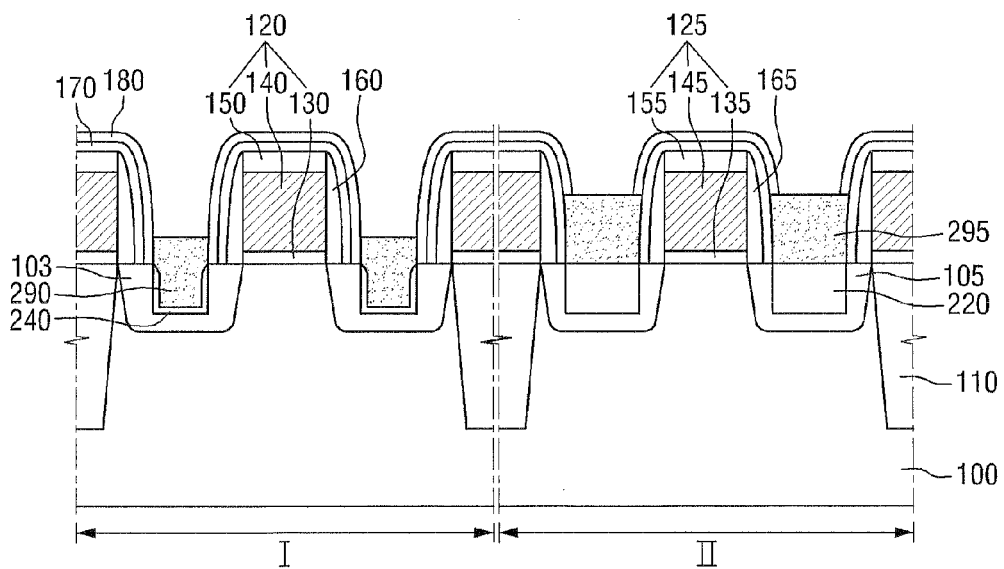

In S130, the second pre-silicide layer 230 including a fourth material is formed on the stress layer 220. The second pre-silicide layer 230, as shown in FIG. 9, is changed to a second silicon layer 295 by an annealing process. The second pre-silicide layer 230 may be, but is not limited to, SiB, and the fourth material may be, but is not limited to, B.

Figure 6:
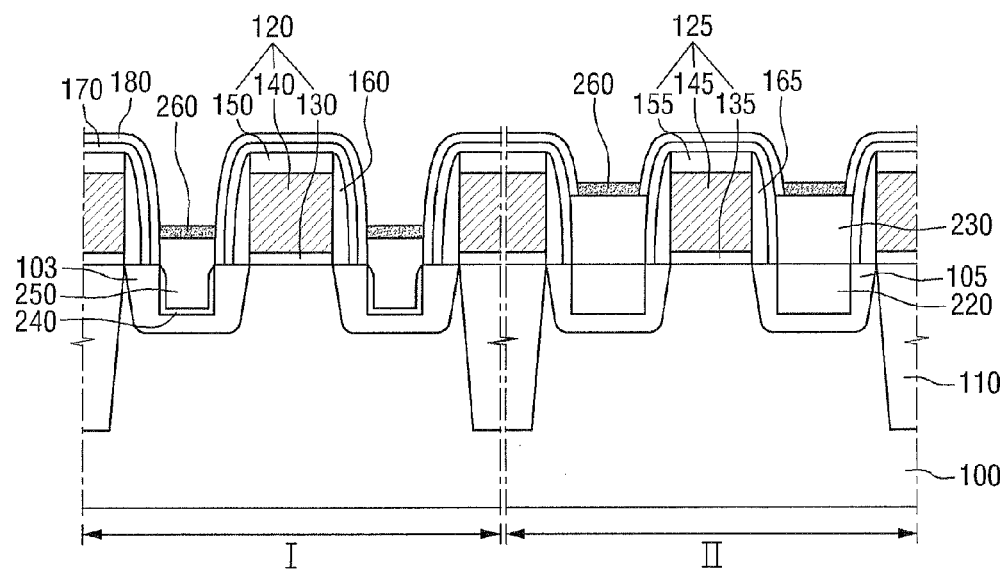

The second pre-silicide layer 230 may serve to improve the performance of a PMOS transistor in the PMOS area. In addition, the second pre-silicide layer 230 may serve to prevent a material included in a metal layer 260, as shown in FIG. 6, from reaching the stress layer 220 in an annealing process. This will be described in detail later.

The stress layer 220 and the second pre-silicide layer 230 may be formed within the second recess 215 by a selective epitaxial growth (SEG) process. Therefore, the stress layer 220 and the second pre-silicide layer 230 may include, but are not limited to, epitaxial layers.

Figure 4:
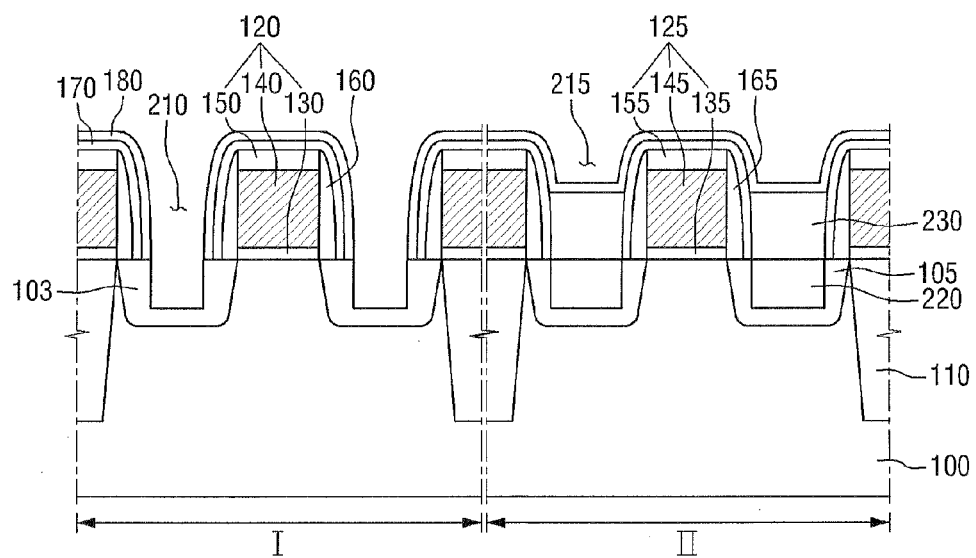
Figure 5:
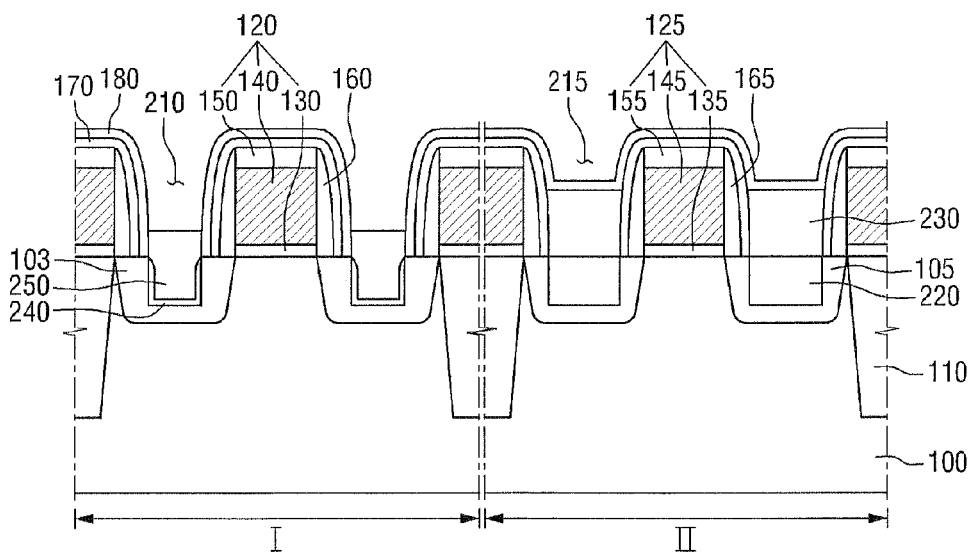

Referring to FIGS. 1 and 4, in S140, a first recess 210 is formed on at least one of both sides of the first gate electrode structure 120. For example, the first recess 210 may be formed in the first area I of the substrate 100. A second block layer 180 is formed on the resulting structure of FIG. 3, and the first recess 210 may be formed by etching a portion of the first area I of the substrate 100 to a predetermined depth. The portion is a region on which the first gate electrode structure 120 is not disposed. The second block layer 180 may be conformally formed. As shown in FIG. 5, the second block layer 180 may serve to prevent the formation of a diffusion prevention layer 240 and a first pre-silicide layer 250 in the second area II in S150.

In the drawings, the first recess 210 and the second recess 215 are box-shaped. However, the present inventive concept is not limited thereto, and the first recess 210 and the second recess 215 may have various shapes. For example, the first recess 210 and/or the second recess 215 may be shaped like the Greek letter "sigma."

Referring to FIGS. 1 and 5, in S150, the diffusion prevention layer 240 including a first material is formed within the first recess 210. The diffusion prevention layer 240 may be conformally formed conformally on inner walls of the first recess 210. The first material may include C, and the diffusion prevention layer 230 may include SiC.

In S160, the first pre-silicide layer 250 is formed on the diffusion prevention layer 240. The first pre-silicide layer 250 may serve to apply tensile stress to a channel region of the first area I. In the first area I, an NMOS transistor is formed. Tensile stress applied to the channel region of the first area I may increase mobility of electrons of the NMOS transistor. To apply the tensile stress, the first pre-silicide layer 250 may include a material having a smaller lattice constant than the material that the substrate 100 includes. For example, if the substrate 100 includes silicon, the first pre-silicide layer 250 may include SiP having a smaller lattice constant than silicon. Therefore, a second material may include P and may include a material different from the first material.

The first pre-silicide layer 250 may serve to apply tensile stress to the channel which is formed in an upper region of the substrate 100 under the first gate electrode structure 120. The first pre-silicate layer 250 may have a thickness to such an extent that the first pre-silicate layer 250 laterally overlaps the channel region. For example, the channel region is disposed in the upper region of the substrate 100 under a bottom surface of the first gate electrode structure 120. A top surface of the first pre-silicide layer 250 is higher than the bottom surface of the first gate electrode structure 120. For example, the top surface of the first pre-silicate layer 250 is higher than a top surface of the substrate 100 which is not recessed. For example, the top surface of the first pre-silicide layer 250 may be about 300 nm or less higher than the top surface of the substrate 100.

Referring to FIGS. 1 and 6, in S170, the metal layer 260 is formed on the first and second pre-silicide layers 250 and 230. Prior to forming the metal layer 260, the second block layer 180 formed on the second pre-silicide layer 230 is partially removed to expose an upper surface of the second pre-silicide layer 230. The metal layer 260 is selectively formed on the first and second pre-silicide layers 250 and 230. Alternatively, a preliminary metal layer (not shown) may be blanketly formed on the resulting structure of FIG. 5 to form the metal layer 260. In this case, the metal layer 260 may be formed by partially removing the preliminary metal formed on the second block layer 180. The metal layer 260 may have at least enough thickness to entirely change the first pre-silicide layer 250 to silicide in S180, S190, and S200. The metal layer 260 may include, but is not limited to, Ni, Pt, or NiPt.

Figure 7:
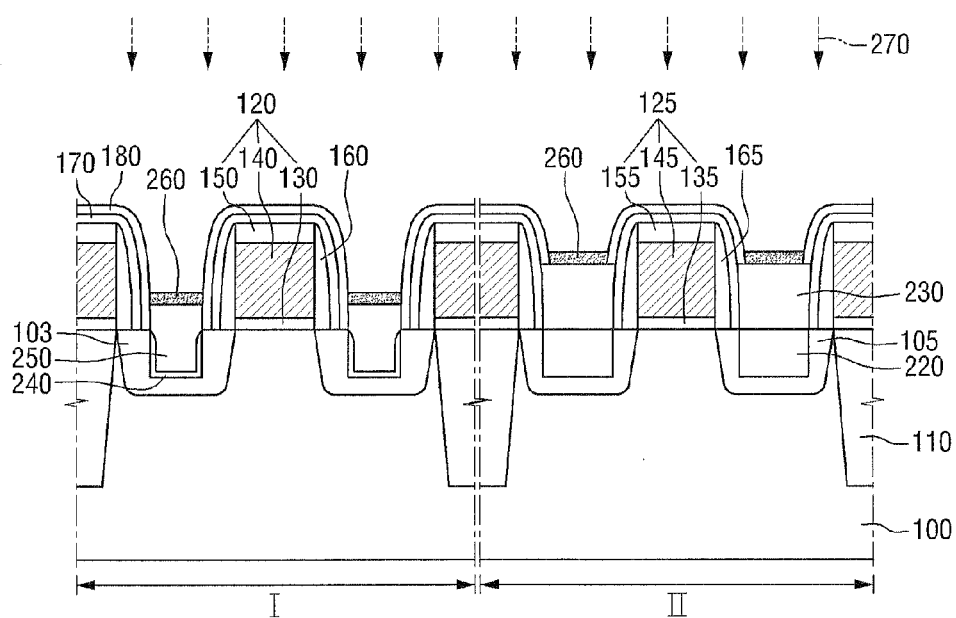
Figure 8:
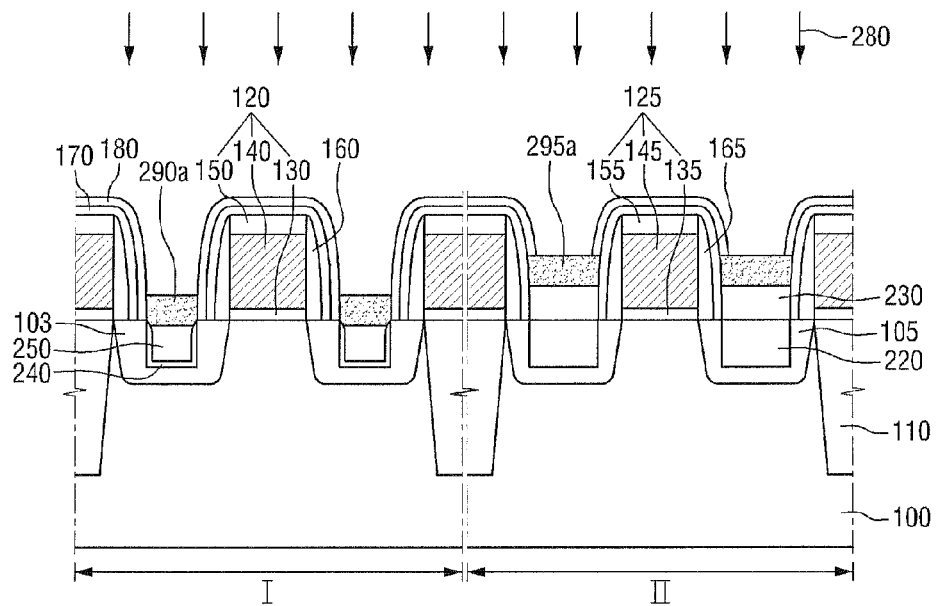

Referring to FIGS. 1, 7 and 8, the substrate 100 is annealed. For example, in S180 and S190, the annealing process may include a first annealing process of S180, indicated by reference numeral 270 in FIG. 7, a second annealing process of S190, indicated by reference numeral 280 in FIG. 8. The first annealing process 270 may be performed at a first temperature, and the second annealing process 280 may be performed at a second temperature. The first temperature is lower than the second temperature.

Referring to FIG. 7, after the metal layer 260 is formed, the first annealing process 270 of S180 is performed at the first temperature for a predetermined annealing time. The first temperature may be, but is not limited to, about 300° C. or below. Referring to FIG. 8, a material (such as Ni or Pt) of the metal layer 260 is diffused to the first and second pre-silicide layers 250 and 230 to form preliminary silicides 290a and 295a. Here, for the predetermined diffusion time, the material of the metal layer 260 is diffused to a predetermined depth in the first and second pre-silicide layers 250 and 230, but not to the bottom of the first and second pre-silicide layers 250 and 230. In FIG. 8, the material of the entire metal layer 260 is entirely diffused to the first and second pre-silicide layers 250 and 230, and thus the metal layer 260 does not remain on the first and second pre-silicide layers 250 and 230. Alternatively, the metal layer 260, after the first annealing process of S180, may partially remain on either of the first and second pre-silicide layers 250 and 230. In this case, the remaining portion of the metal layer 260 may be removed before the second annealing process 280 is performed. The amount of the material of metal layer 260 which is diffused to the first and second pre-silicide layers 250 and 230 may be adjusted by changing the first temperature, the annealing time, etc.

If the metal layer 260 includes Ni and Pt, the preliminary silicides 290a and 295a formed by the first annealing process may have a composition of $(Ni_{0.9}Pt_{0.1})_x Si$ (x>1).

Next, the second annealing process 280 of S190 is performed at the second temperature for a predetermined annealing time. The second temperature may be equal to or higher than a liquefaction temperature of the first pre-silicide layer 250 and the metal layer 260. In the second annealing process of S190, both the first pre-silicide layer 250 and the metal layer 260 may be liquefied and mixed with each other. The second temperature may be, but is not limited to, about 1000° C. or above. The second temperature may be lower than a liquefaction temperature of the substrate 100 to prevent liquefaction of the substrate 100. For example, if the substrate 100 includes Si, the second temperature may be about 1400° C. or less.

The second annealing process 280 may be performed for a short time. Liquefied material of the first pre-silicide layer 250 and/or the metal layer 260 may permeate into the first and second gate electrode structures 120 and 125 and/or the stress layer 220. This permeation may cause transistors to malfunction. Accordingly, the second annealing process 280 may be performed for a short time to prevent the permeation. For example, the annealing time of the second annealing process 280 may range from about 0.01 ms (millisecond) to about 100 ms.

If the material (such as Ni and Pt) included in the metal layer 260 is diffused to the stress layer 220, the stress layer 220 may apply less compressive stress to the channel region. In an exemplary embodiment, the second annealing process 280 may be controlled for the material included in the metal layer 260 to be diffused within the second pre-silicide layer 230. For example, the second pre-silicide layer 230 may be thick enough to prevent the material included in the metal layer 260 from reaching the stress layer 220 for the annealing temperature and/or time of the second annealing process 280. In an exemplary embodiment, the second pre-silicide layer 230 may be formed as thick as or thicker than the first pre-silicide layer 250.

Referring to FIG. 9, in S200, the second annealing process 280 may further diffuse the material (such as Ni an Pt) included in the preliminary silicides 290a and 295a to the remaining first pre-silicide layer 250 and the second pre-silicide layer 230 to form a first silicide layer 290 and a second silicide layer 295. During the formation of the first silicide layer 290, the diffusion prevention layer 240 prevents the material (such as Ni and Pt) from diffusing to the substrate 100. Therefore, the first silicide layer 250 is formed in the first recess 210.

If the metal layer 260 includes Ni and Pt, the first silicide layer 250 may include a ternary metal silicide layer such as $(Ni_{0.9}Pt_{0.1})_x Si$ (x=1). The first silicide layer 290 may include a monocrystalline layer by re-crystallizing the liquefied material of the first pre-silicide layer 250 and the metal layer 260 in the second annealing process 280. Therefore, a grain boundary does not exist in the first silicide layer 290.

Similarly, the second silicide layer 295 may include a ternary metal silicide layer including $(Ni_{0.9}Pt_{0.1})_x Si$ (x=1). In addition, the second silicide layer 295 may include a monocrystalline layer.

The first silicide layer 290 has a first thickness, and the second silicide layer 295 has a second thickness. Since the second pre-silicide layer 230 is thicker than the first pre-silicide layer 250, the second thickness is greater than the first thickness.

In an exemplary embodiment, after the second recess 215 is formed in the second area II, the first recess 210 is formed in the first area I. However, the present inventive concept is not limited thereto. For example, after the first recess 210 may be formed in the first area I, the diffusion prevention layer 240 and the first pre-silicide layer 250 may be formed in the first recess 210. Then, the second recess 215 may be formed in the second area II, and the stress layer 220 and the second pre-silicide layer 230 may be formed in the second recess 215.

The diffusion prevention layer 240 formed in the first area I has the following effects.

If annealing is performed after the first pre-silicide layer 250 is formed in the first recess 210 and the metal layer 260 is formed on the first pre-silicide layer 250, the first pre-silicide layer 250 and the metal layer 260 change into the first silicide layer 290. Here, during the second annealing process 280, the first pre-silicide layer 250 and the metal layer 260 may be liquefied and may be diffused to the substrate 100. If the material included in the metal layer 260 permeates into the substrate 100, for example, the channel region, leakage may occur, causing a transistor to malfunction. Consequently, this reduces the reliability of the semiconductor device. However, the diffusion prevention layer 240 conformally formed on side surfaces and a bottom surface of the first recess 210 prevents the material included in the metal layer 260 from permeating into the substrate 100. Consequently, the reliability of the semiconductor device is increased.

Furthermore, the diffusion preventing layer 240 prevents the material included in the metal layer 260 from permeating into the channel region. Therefore, the first silicide layer 290 is formed adjacent to the channel region without reducing the reliability of the NMOS transistor having the first gate electrode 120. As a result, the first silicide layer 290 may effectively apply tensile stress to the channel region.

Since the diffusion prevention layer 240 prevents the material included in the metal layer 260 from permeating into the substrate 100, both the metal layer 260 and the first pre-silicide layer 250 may be liquefied during annealing. Therefore, the second annealing process 280 may be performed at a high temperature of 1000° C. or above. Accordingly, the first silicide layer 290 may be formed as a monocrystalline layer. When the first silicide layer 290 is a monocrystalline layer, it may have a higher tensile stress (e.g., 2 GPa or greater) than when it is a polycrystalline layer. Consequently, the semiconductor device operates at high speed.

A method of fabricating a semiconductor device according to an exemplary embodiment of the present inventive concept will now be described with reference to FIGS. 10 through 19. For simplicity, a description of features described above will be omitted, and the following description will focus on differences from the exemplary embodiment as described above.

Figure 10:
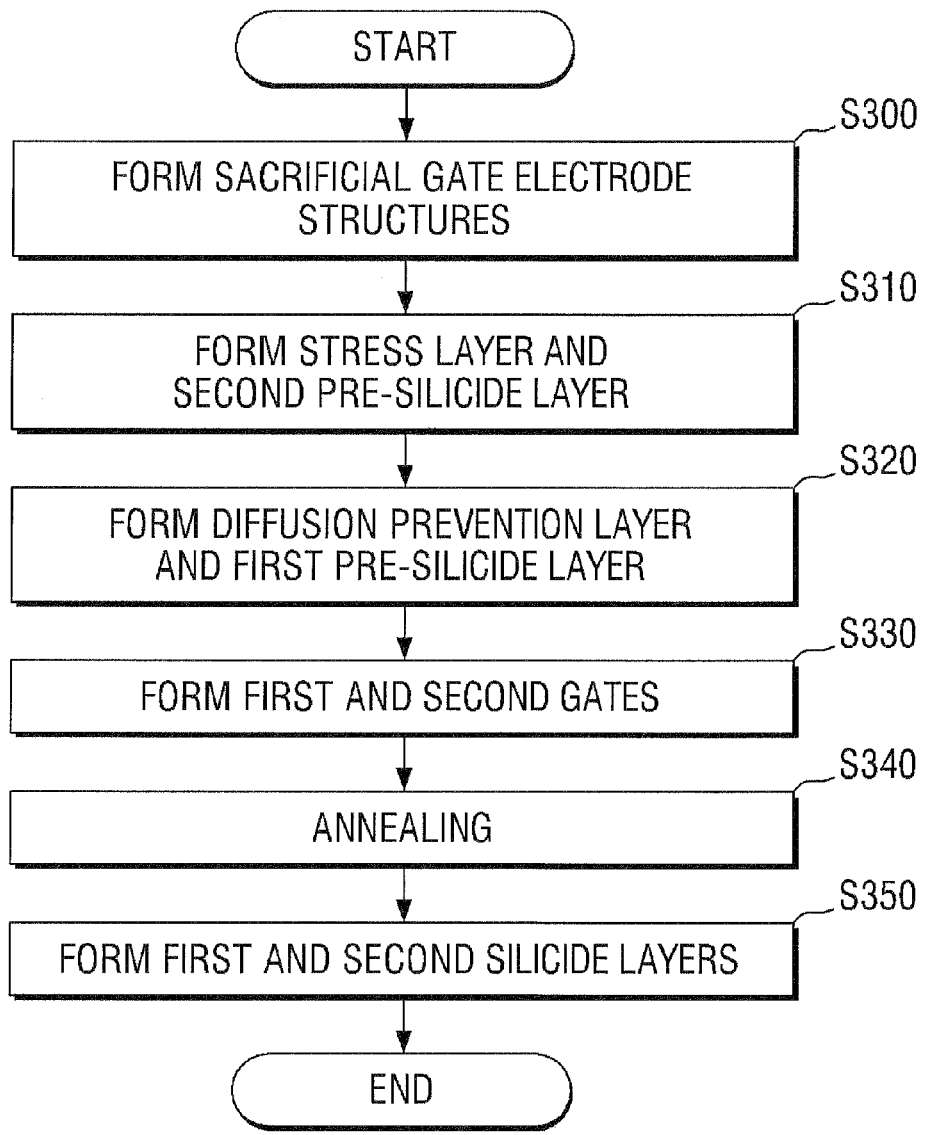
FIG. 10 is a flowchart illustrating a method of fabricating a semiconductor device according to an exemplary embodiment of the inventive concept.

FIG. 10 is a flowchart illustrating a method of fabricating a semiconductor device according to an exemplary embodiment of the present inventive concept. FIGS. 11 through 19 are views illustrating steps of a method of fabricating a semiconductor device according to an exemplary embodiment of the present inventive concept.

Figure 11:
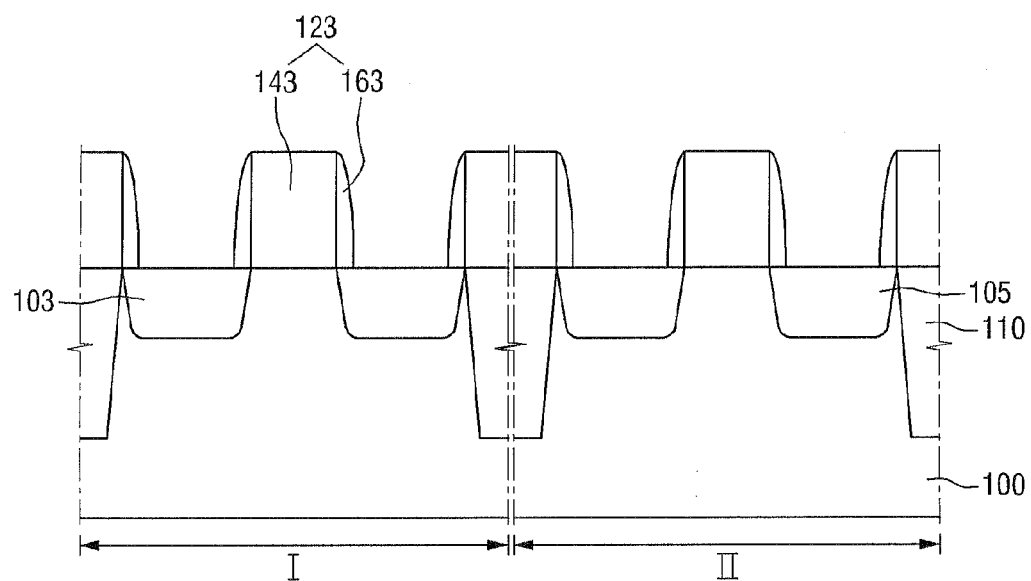
FIGS. 11 through 19 are views illustrating steps of a method of fabricating a semiconductor device according to an exemplary embodiment of the inventive concept.

Referring to FIGS. 10 and 11, in S300, a plurality of sacrificial gate electrode structures 123 are formed on a substrate 100. Unlike in the method of fabricating a semiconductor device according to the exemplary embodiment as described above, gate electrode structures will replace the sacrificial gate electrodes 123 in a later process S330. A spacer 163 is formed on side surfaces of each of the sacrificial gate electrode structures 123.

Figure 12:
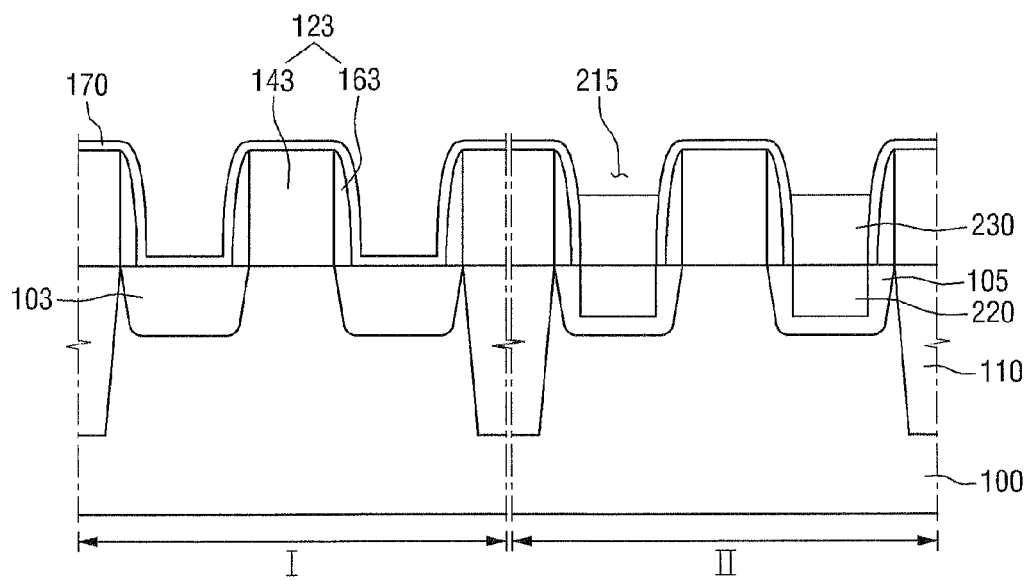

Referring to FIGS. 10 and 12, in S310, a stress layer 220 and a second pre-silicide layer 230 are formed in a second area II. For example, a first block layer 170 is conformally formed on the substrate 100, and a second recess 215 is formed on both sides of the sacrificial gate electrode structure 123 located in the second area II. The substrate 100 may be partially etched in the process of forming the second recess 215. Next, the stress layer 220 is formed in the second recess 215, and the second pre-silicide layer 230 is formed on the stress layer 230. A top surface of the stress layer 220 may be as high as or higher than a top surface of the substrate 100. The second pre-silicide layer 230 may be thicker than a first pre-silicide layer 250 which will be described later.

Figure 13:
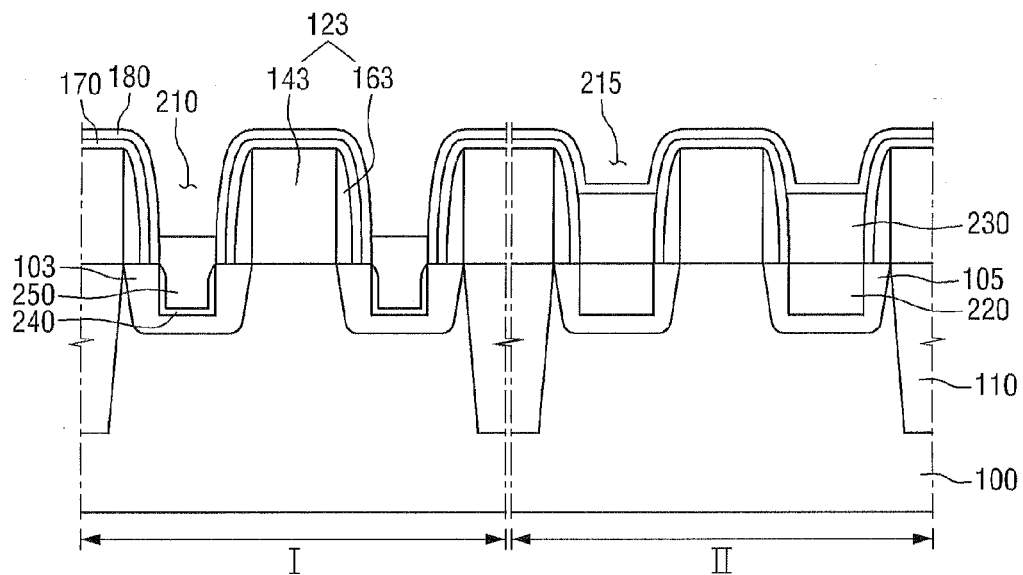
Figure 14:
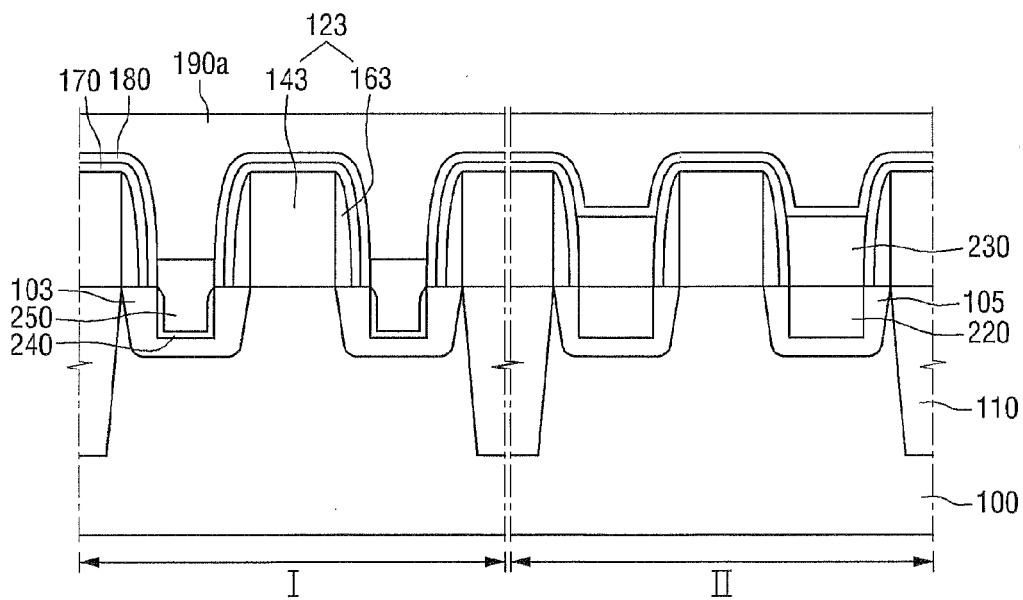

Referring to FIGS. 10 and 13, in S320, a diffusion prevention layer 240 and the first pre-silicide layer 250 are formed in a first area I. For example, a second block layer 180 is conformally formed on the substrate 100, and a first recess 210 is formed on both sides of the sacrificial gate electrode structure 123 located in the first area I. The substrate 100 may be partially etched in the process of forming the first recess 210. The diffusion prevention layer 240 is conformally formed on side surfaces and a bottom surface of the first recess 210, and the first pre-silicide layer 250 is formed on the diffusion prevention layer 240.

Figure 15:
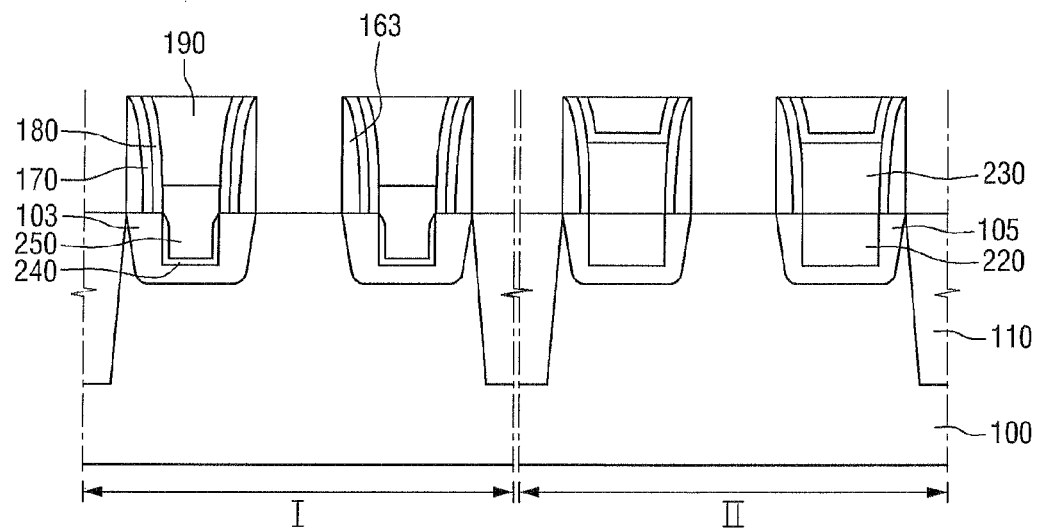

Referring to FIGS. 10 and 14 through 16, in S330, after the sacrificial gate electrode structures 123 are removed, a first gate 300 is formed in the first area I, and the second gate 305 is formed in the second area II. For example, referring to FIG. 14, an insulating layer 190a is formed on the resulting structure of FIG. 13. Then, the insulating layer 190a is etched until the sacrificial gate electrode structures 123 are exposed as shown in FIG. 15.

After the sacrificial gate electrode structures 123 are exposed, the sacrificial gate electrodes 123 are removed and a top surface, underneath the sacrificial gate electrodes 123, of the substrate 100 is exposed. A gate is formed on the top surface of the substrate 100. For example, referring to FIG. 16, the first gate 300 is formed in the first area I, and the second gate 305 is formed in the second area II.

A gate insulating layer 310 may be conformally formed on the top surface, underneath the sacrificial gate electrodes 123, of the substrate 100. The gate insulating layer 310 may include a high-k material having a higher dielectric constant than a silicon oxide layer. For example, the gate insulating layer 310 may include a material such as HfSiON, HfO$_2$, ZrO$_2$, Ta$_2$O$_5$, TiO$_2$, SrTiO$_3$, and/or (Ba,Sr)TiO$_3$.

Figure 16:
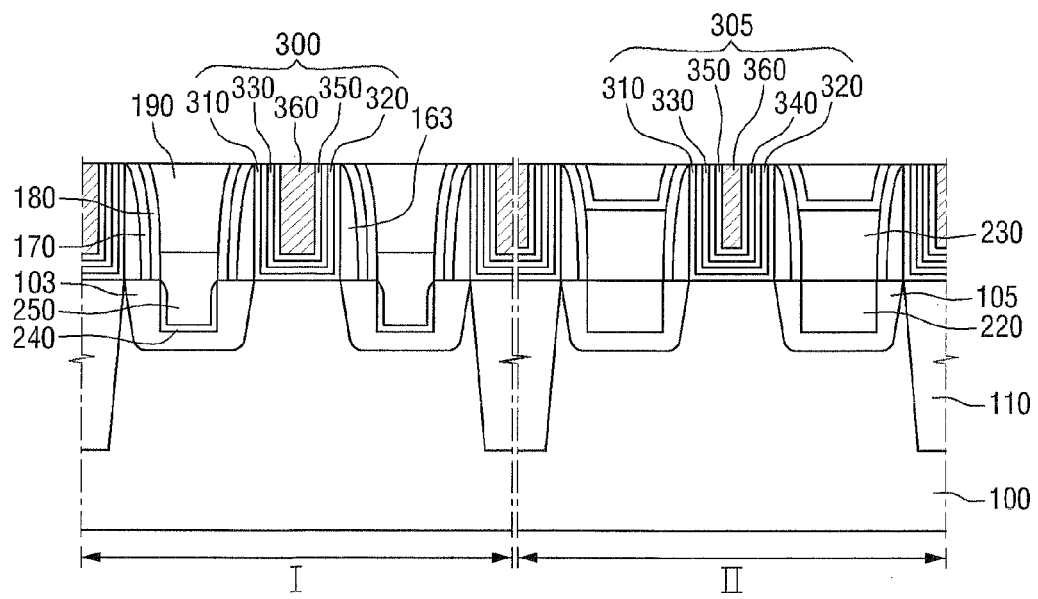

A capping layer 320 is formed on the gate insulating layer 310. As shown in FIG. 16, the capping layer 320 is conformally formed on side surfaces and a bottom surface of the gate insulating layer 310. The capping layer 320 may include, e.g., TiN.

An etch stop layer 330 is formed on the capping layer 320. For example, the etch stop layer 330 is conformally formed on side surfaces and a bottom surface of the capping layer 320. The etch stop layer 330 may include, e.g., TaN. The etch stop layer 330 may serve to prevent the gate insulating layer 310 and the capping layer 320 of the first area I from being etched when a work function control layer 340 of a second conductivity type in the second area II is etched.

In FIG. 16, the capping layer 320 and the etch stop layer 330 are separately formed. Alternatively, a single layer may be formed instead of two separate layers 320 and 330. In this case, the single layer may include TiN and/or TaN.

A preliminary work function control layer of the second conductivity type may be conformally formed on the etch stop layer 330. The preliminary work function control layer of the second conductivity type in the first area I is removed to form the work function control layer 340 of the second conductivity type in the second area II. The work function control layer 340 may include a P-type work function control layer such as a TiN layer.

The work function control layer 340 of the second conductivity type may serve to adjust the work function of a metal gate 360 of a second gate 305 for a PMOS transistor.

Next, a work function control layer 350 of a first conductivity type is formed. For example, the work function control layer 350 of the first conductivity type may be conformally formed on the etch stop layer 330 in the first area I and conformally formed on the work function control layer 340 of the second conductivity type in the second area II. The first conductivity type may include an N-type work function control layer. The work function control layer 350 of the first conductivity type may adjust a work function of a metal gate for an NMOS transistor. The work function control layer 350 of the first conductivity type may include TiAl, TiAlN, TaC, TiC, and/or HfSi.

The gate metal 360 is formed on the work function control layer 350 of the first conductivity type to fill a region defined by the work function control layer 350. The gate metal 360 may include, but is not limited to, Al and/or W.

Although not shown in the drawings, the gate insulating layer 310, the capping layer 320, the etch stop layer 330, the work function control layer 340 of the second conductivity type, the work function layer 350 of the first conductivity type, and the gate metal 360 may also be stacked sequentially on the insulating layer 190 in the process of forming the first and second gate electrodes 300 and 305. However, they may be etched to expose the insulating layer 190 to form the first and second gate electrodes 300 and 305 as shown in FIG. 16.

Figure 17:
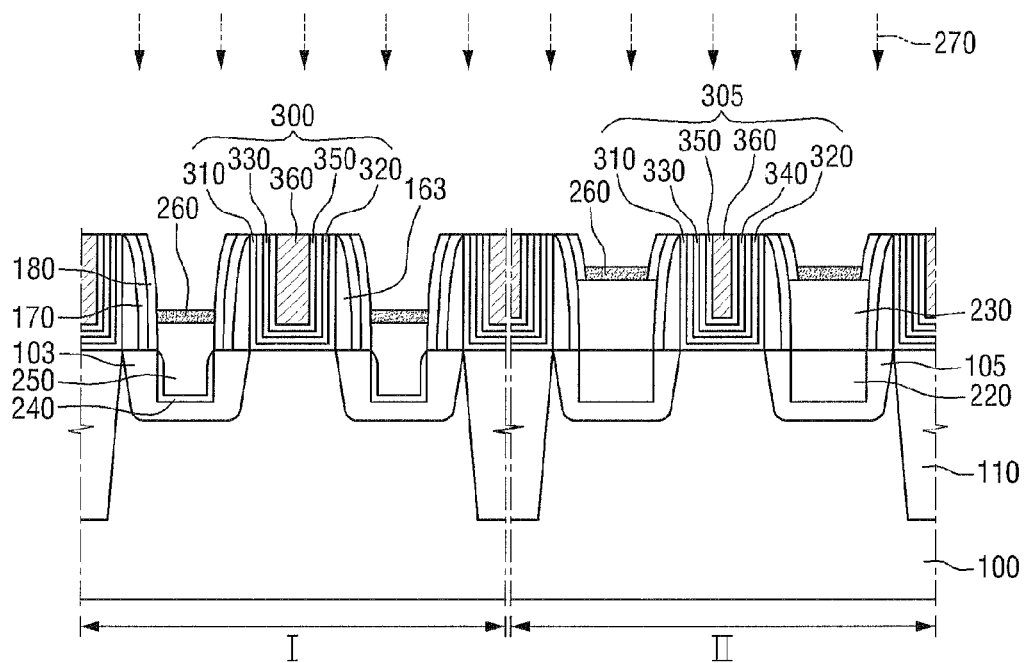

Referring to FIGS. 10 and 17, in S340, an annealing process is performed. For example, the insulating layer 190 on the first and second pre-silicide layers 250 and 230 is removed before a first annealing process 270 is performed. Then, a metal layer 260 is formed on the exposed first and second pre-silicide layers 250 and 230. The metal layer 260 may include a material such as Ni and/or Pt and may be formed thick enough to silicide the entire first pre-silicide layer 250. The first annealing process 270 may be performed at a first temperature.

Figure 18:
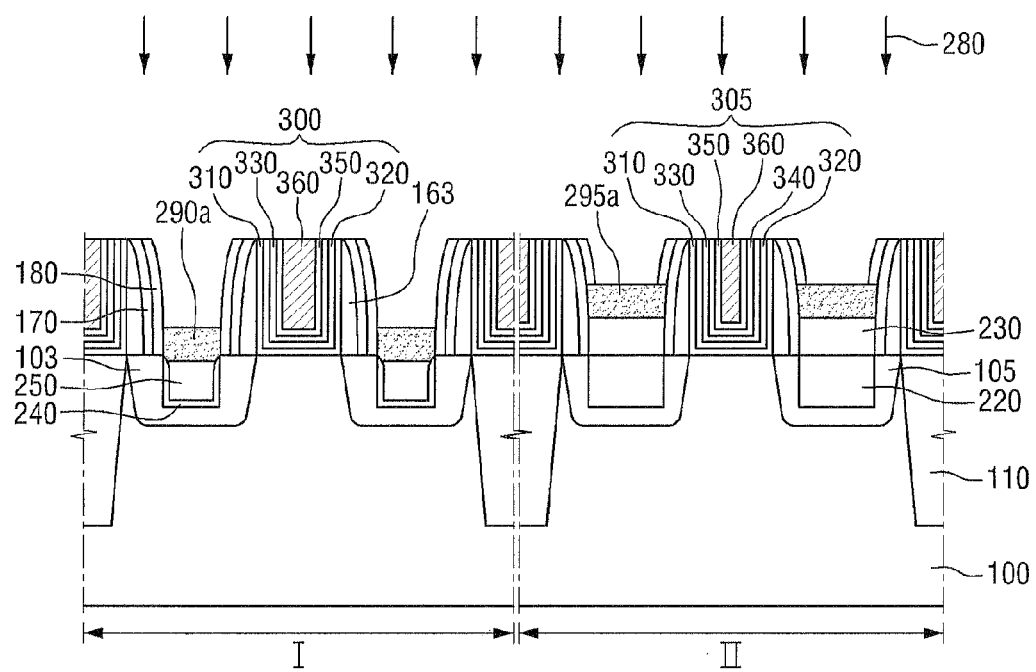

Referring to FIGS. 10 and 18, in S340, a second annealing process 280 is performed. The second annealing process 280 may be performed at a second temperature. The second temperature may be higher than the first temperature and may be, for example, about 1000° C. or above. In an exemplary embodiment, the second annealing process 280 may include a rapid thermal process (RTP). Therefore, the second annealing process 280 may be performed for a short time, for example, about 10 ms or less.

Figure 19:
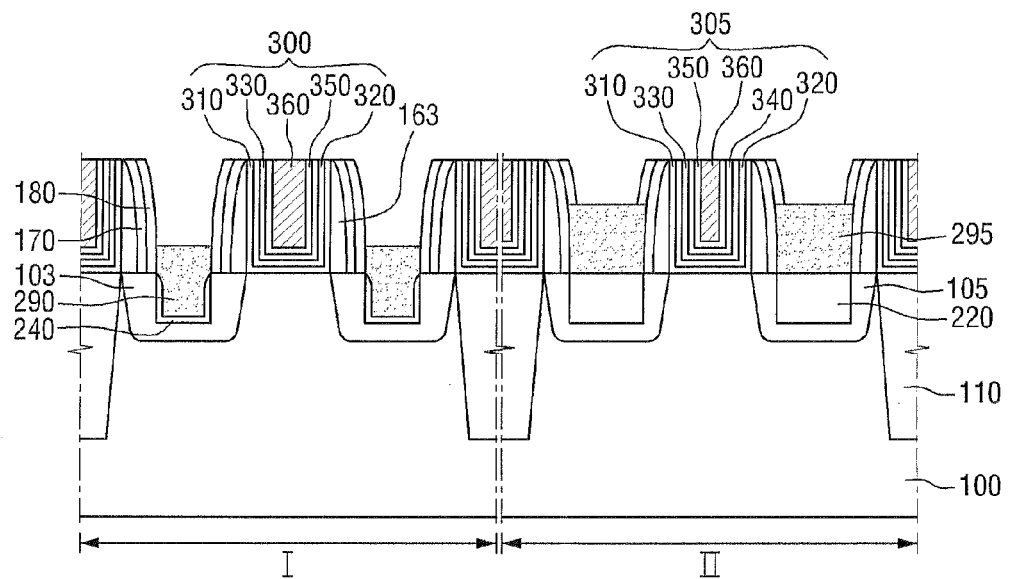

Referring to FIGS. 10 and 19, in S350, a first silicide layer 290 and a second silicide layer 295 are formed. The first silicide layer 290 is formed in the first area I, and the second silicide layer 295 is formed in the second area II. Each of the first and second silicide layers 290 and 295 may include a monocrystalline structure and may include Ni, Pt and Si.

A method of fabricating a semiconductor device according to an exemplary embodiment of the present inventive concept will now be described with reference to FIGS. 20 through 28. For simplicity, a description of features described above will be omitted, and the following description will focus on differences from the exemplary embodiments as described above.

FIGS. 20 through 28 are cross-sectional views illustrating steps of a method of fabricating a semiconductor device according to an exemplary embodiment of the present inventive concept.

Figure 20:
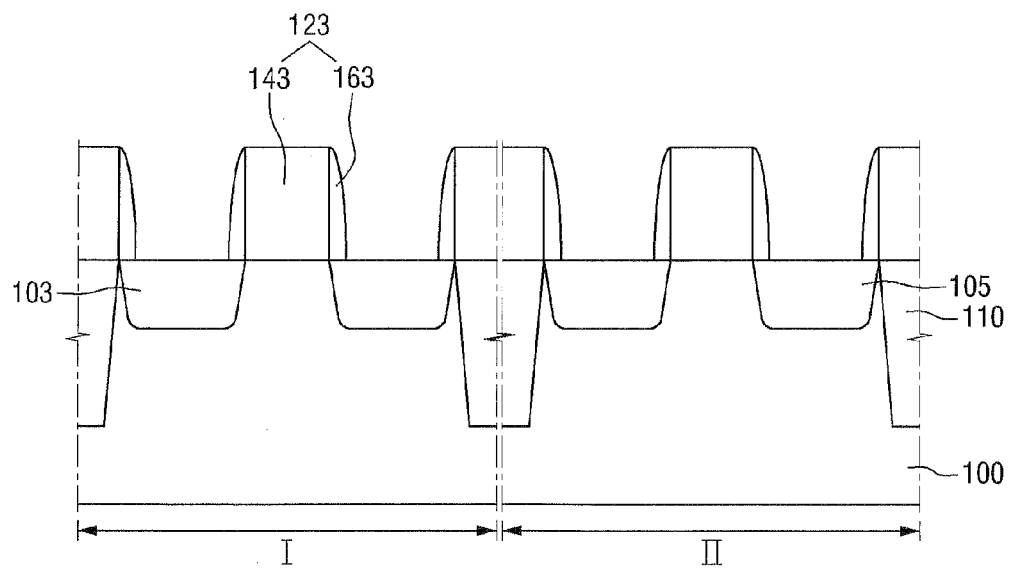
FIGS. 20 through 28 are views illustrating steps of a method of fabricating a semiconductor device according to an exemplary embodiment of the inventive concept.

Referring to FIG. 20, a plurality of sacrificial gate electrode structures 123 are formed on a substrate 100. A spacer 163 is formed on side surfaces of each of the sacrificial gate electrode structures 123.

Figure 21:
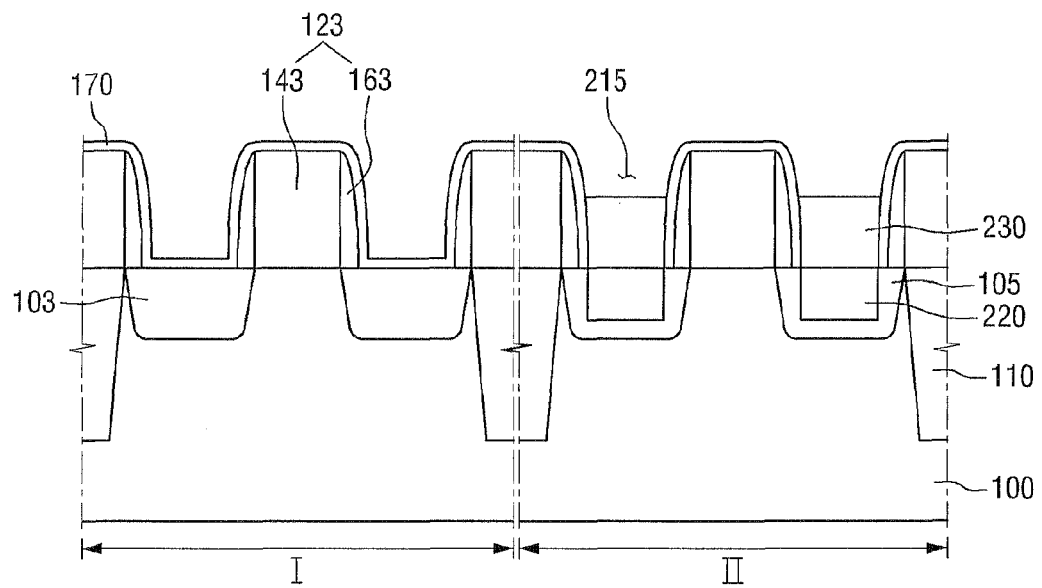

Referring to FIG. 21, a stress layer 220 and a second pre-silicide layer 230 are formed in a second area II. For example, a first block layer 170 is conformally formed on the substrate 100, and a second recess 215 is formed on both sides of the sacrificial gate electrode structure 123 in the second area II. The substrate 100 is partially etched in the process of forming the second recess 215. Next, the stress layer 220 is formed in the second recess 215, and the second pre-silicide layer 230 is formed on the stress layer 230. A top surface of the stress layer 220 may be as high as or higher than a top surface of the substrate 100. The second pre-silicide layer 230 may be thicker than a first pre-silicide layer 250 which will be described later.

Figure 22:
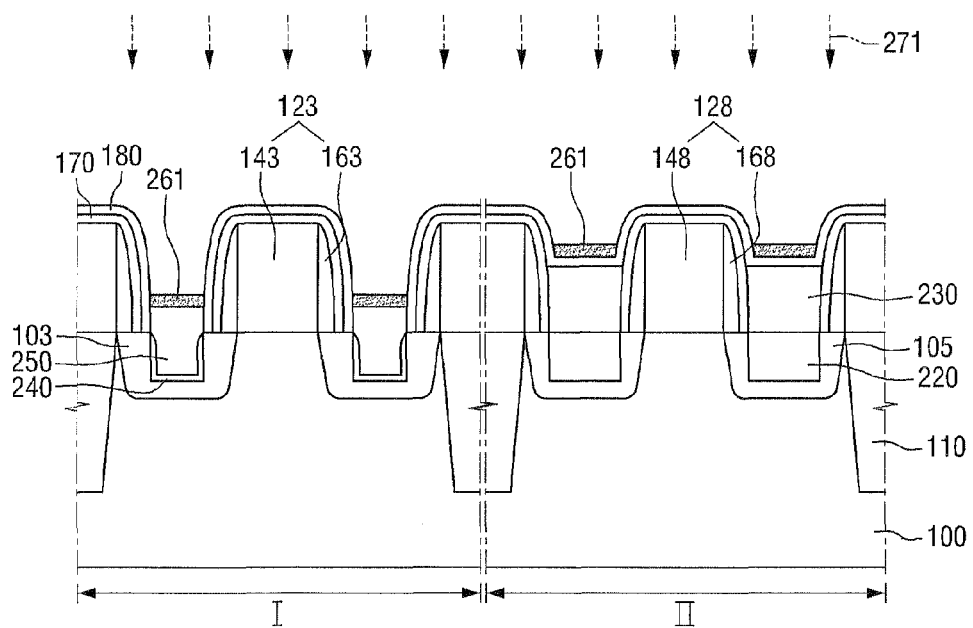

Referring to FIG. 22, a diffusion prevention layer 240 and the first pre-silicide layer 250 are formed in a first area I. For example, a second block layer 180 is conformally formed on the substrate 100, and a first recess 210 is formed on both sides of the sacrificial gate electrode structure 123 in the first area I. The substrate 100 may be partially etched in the process of forming the first recess 210. The diffusion prevention layer 240 is conformally formed on side surfaces and a bottom surface of the first recess 210, and the first pre-silicide layer 250 is formed on the diffusion prevention layer 240.

Figure 23:
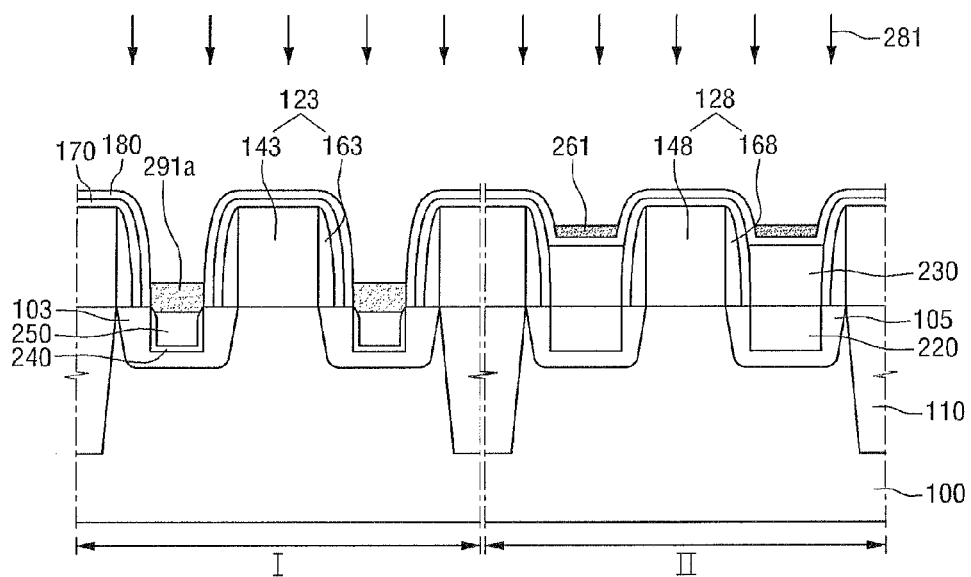

Next, the second block layer 180 is partially removed in the first area I. A metal layer 261 is formed on the second block layer 180 of the second area II and on the first pre-silicide layer 250. The metal layer 261 may include Ni, Pt, or the like. Then, a first annealing process 271 is performed to form a preliminary silicide layer 291a as shown in FIG. 23. In the first annealing process 271, metal atoms of the metal layer 261 may be diffused into the first pre-silicate layer 250, and the second block layer 180 may prevent the metal atoms of the metal layer 261 from being diffused into the first pre-silicate layer 230.

Referring to FIG. 23, a second annealing process 281 is performed on the substrate 100. In the second annealing process 281, metal atoms of the metal layer 261 of the first area I may be diffused into a first silicide layer 290 to form the preliminary silicide layer 291a. In the second area II, however, the second block layer 180 may prevent the metal atoms of the metal layer 261 from being diffused into the second pre-silicide layer 230.

Figure 24:
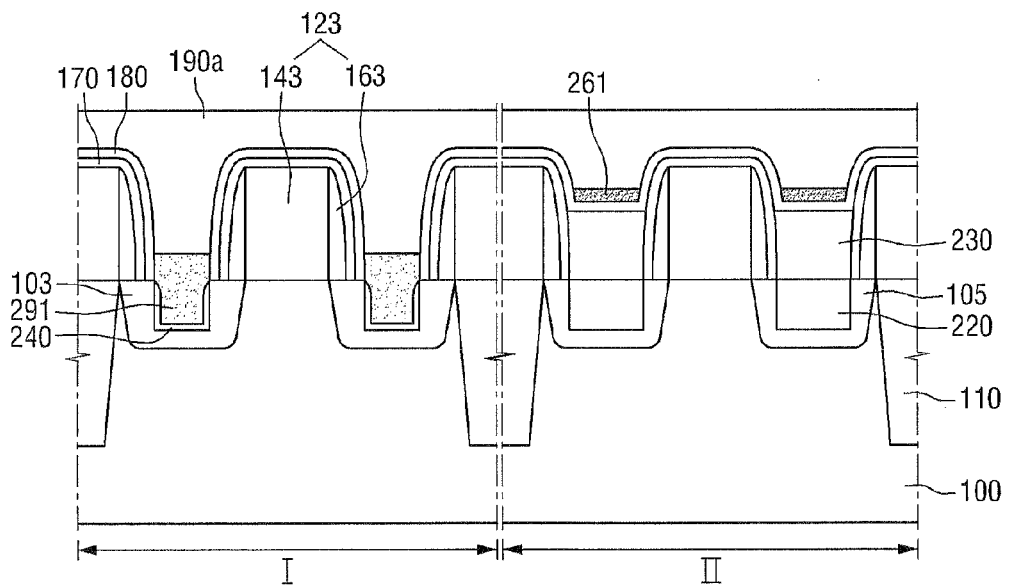

Referring to FIG. 24, an insulating layer 190a is formed on the resulting structure of FIG. 23. In FIG. 24, the metal layer 261 remains in the second area II. Alternatively, the metal layer 261 may be removed before the insulating layer 190a is formed.

Figure 25:
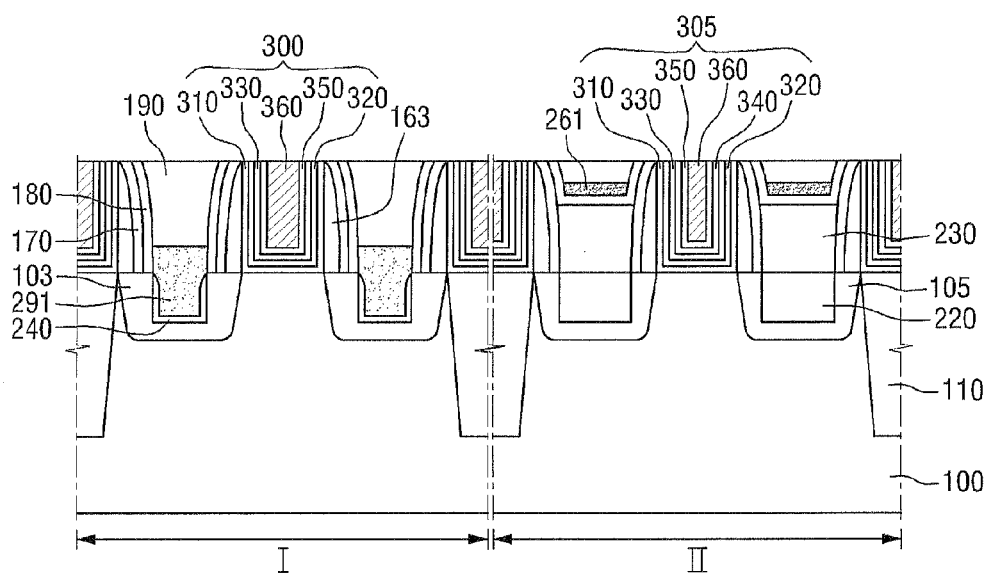

Referring to FIG. 25, the sacrificial gate electrode structures 123 are removed. Then, a first gate 300 is formed in the first area I, and a second gate 305 is formed in the second area II. For example, the first and second gates 300 and 305 replace the sacrificial gate electrode structures 123. The method of forming the first and second gates 300 and 305 has been described above, and thus a detailed description thereof will be omitted here.

Figure 26:
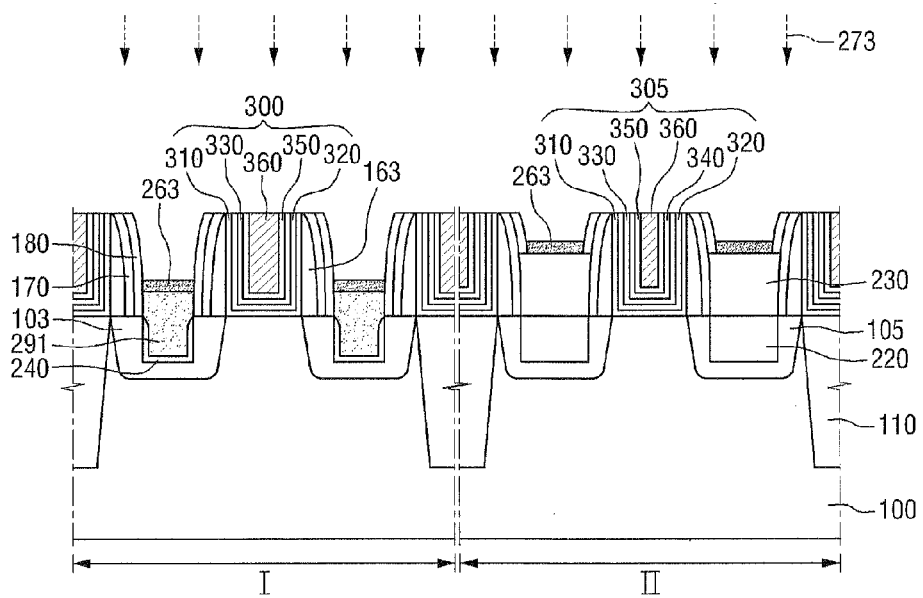
Figure 27:
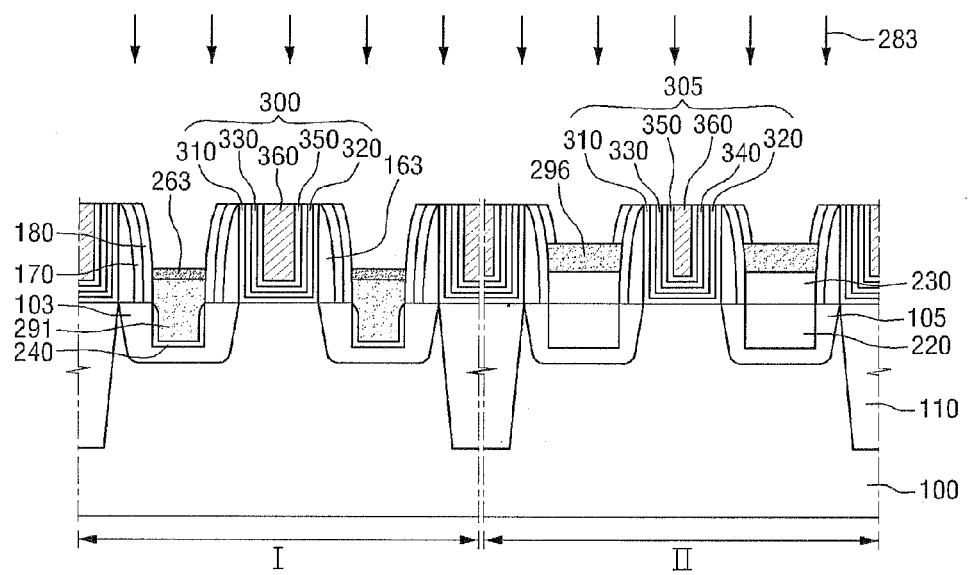
Figure 28:
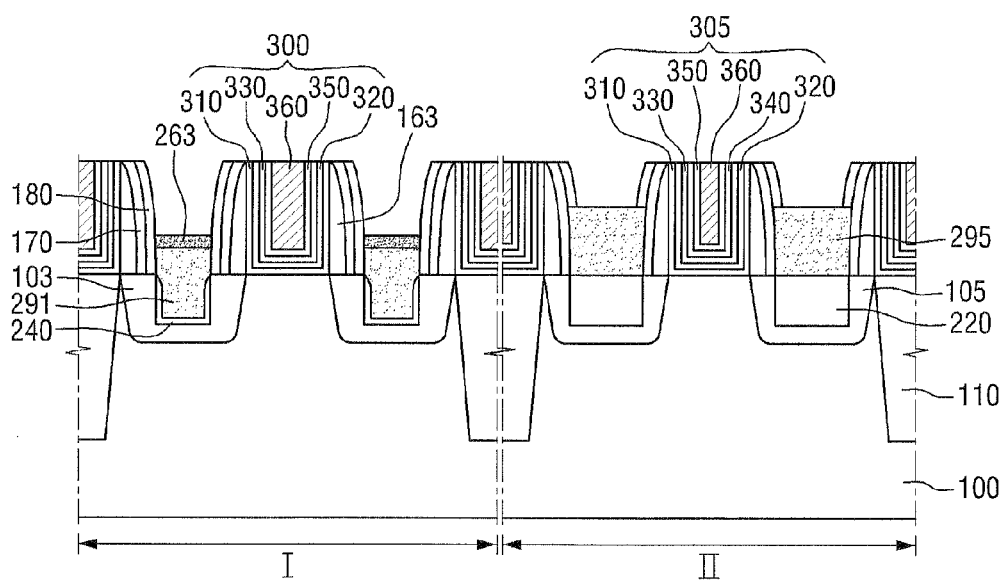

Referring to FIGS. 26 and 28, the insulating layer pattern 190 is removed to expose upper surfaces of a first silicide layer 291 and a second pre-silicide layer 230. Next, a metal layer 263 is formed on the upper surfaces of the second pre-silicide layer 230 and the first silicide layer 291. Next, a third annealing process 273 and a fourth annealing process 283 are performed sequentially. The third annealing process 273 and the fourth annealing process 283 change the second pre-silicide layer 230 and the metal layer 263 into a second silicide layer 295. The third annealing 273 may be, but is not limited to, identical to the first annealing 271, and the fourth annealing 283 may be, but is not limited to, identical to the second annealing 281. The third annealing 273 and the fourth annealing 283 may be performed at a temperature and for a period of time appropriate for the formation of the second silicide layer 295.

Since the first silicide layer 291 has already been stabilized by the first and second annealing processes 271 and 281, the third annealing 273 and the fourth annealing 283 do not cause the first silicide layer 291 to be liquefied. In addition, the third annealing 273 and the fourth annealing 283 do not cause the material included in the metal layer 263 to diffuse to the first silicide layer 291. Therefore, the metal layer 263 still remains on the first silicide layer 291. The metal layer 263 may be removed by a subsequent process.

Unlike in the method of fabricating a semiconductor device according to the exemplary embodiment as described above, in the method of fabricating a semiconductor device according to an exemplary embodiment, the first silicide layer 291 and the second silicide layer 295 are not formed simultaneously. If the first silicide layer 291 and the second silicide layer 295 are formed separately, thicknesses of the first silicide layer 291 and the second silicide layer 295 are independently controlled. For example, since the second silicide layer 295 may be formed thin, tensile stress unnecessarily generated by the second silicide layer 296 may be reduced.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A method of fabricating a semiconductor device, the method comprising:
    forming a plurality of first gate electrode structures on a substrate;
    forming a first recess in the substrate, wherein the first recess is formed between two adjacent first gate electrode structures of the plurality of first gate electrode structure;
    forming a diffusion prevention layer, comprising a first material, on the first recess of the substrate, wherein the diffusion prevention layer is conformally formed on a bottom surface and sidewall surfaces of the first recess of the substrate;
    forming a first pre-silicide layer, comprising a second material different from the first material, on the diffusion prevention layer;
    forming a metal layer on the first pre-silicide layer; and
    forming a first silicide layer by performing an annealing process on the substrate,
    wherein metal atoms of the metal layer are diffused to the first pre-silicide layer in the annealing process and the diffusion prevention layer prevents the metal atoms from diffusing to the substrate, and the first silicide layer comprises a monocrystalline layer, and
    wherein the annealing process comprises a first annealing process and a second annealing process, wherein the first annealing is performed at a first temperature and the second annealing is performed at a second temperature higher than the first temperature.

2. The method of claim 1, wherein a height of the first pre-silicide layer measured from the substrate is about 300 nm or less.

3. The method of claim 1, wherein the first pre-silicide layer and the metal layer are liquefied at the second temperature.

4. The method of claim 3, wherein the second annealing is performed for a period of time ranging from about 0.01 ms to about 100 ms.

5. The method of claim 1, wherein the metal layer comprises Ni or Pt.

6. The method of claim 1, wherein the first silicide layer comprises a ternary metal silicide layer.

7. The method of claim 1, wherein the first material comprises carbon (C), and the second material comprises phosphorous (P).

8. The method of claim 1, further comprising: forming a plurality of second gate electrode structures on the substrate; forming a second recess in the substrate, wherein the second recess is formed between two adjacent second gate electrode structures of the plurality of second gate electrode structures; forming a stress layer, comprising a third material, on the second recess; forming a second pre-silicide layer, comprising a fourth material, on the stress layer; forming the metal layer on the second pre-silicide layer; and forming a second silicide layer by performing the annealing process on the substrate, wherein metal atoms of the metal layer are diffused to the second pre-silicide layer.

9. The method of claim 8, wherein a top surface of the stress layer is as high as or higher than the substrate.

10. The method of claim 8, wherein the second silicide layer is thicker than the first silicide layer.

11. A method of fabricating a semiconductor device, the method comprising: forming a plurality of first gate electrode structures on a substrate; forming a first recess in the substrate, wherein the first recess is formed between two adjacent first gate electrode structures of the plurality of first gate electrode structure; forming a diffusion prevention layer, comprising a first material, on the first recess of the substrate, wherein the diffusion prevention layer is conformally formed on a bottom surface and sidewall surfaces of the first recess of the substrate; forming a first pre-silicide layer, comprising a second material different from the first material, on the diffusion prevention layer; forming a metal layer on the first pre-silicide layer; and forming a first silicide layer by performing an annealing process on the substrate, wherein metal atoms of the metal layer are diffused to the first pre-silicide layer in the annealing process and the diffusion prevention layer prevents the metal atoms from diffusing to the substrate, and the first silicide layer comprises a monocrystalline layer, and
    wherein a top surface of teh first pre-silicide layer is higher than a bottom surface of the first gate electrode structure.

12. The method of claim 11, wherein a height of the first pre-silicide layer measured from the substrate is about 300 nm or less.

13. The method of claim 11, wherein the metal layer comprises Ni or Pt.

14. The method of claim 11, wherein the first silicide layer comprises a ternary metal silicide layer.

15. The method of claim 11, wherein the first material comprises carbon (C), and the second material comprises phosphorous (P).

* * * * *